United States Patent
Ito et al.

(10) Patent No.: US 7,811,745 B2
(45) Date of Patent: Oct. 12, 2010

(54) METHOD OF MANUFACTURING SEMICONDUCTOR DEVICE

(75) Inventors: Eiji Ito, Kawasaki (JP); Hideyuki Kinoshita, Yokohama (JP); Tetsuya Kamigaki, Yokohama (JP); Koji Hashimoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1154 days.

(21) Appl. No.: 11/453,087

(22) Filed: Jun. 15, 2006

(65) Prior Publication Data
US 2007/0003881 A1 Jan. 4, 2007

(30) Foreign Application Priority Data
Jun. 16, 2005 (JP) .............................. 2005-176581

(51) Int. Cl.
*H01L 21/00* (2006.01)
(52) U.S. Cl. ........................ 430/313; 430/311; 430/322; 430/323; 430/324
(58) Field of Classification Search .................. None
See application file for complete search history.

(56) References Cited

U.S. PATENT DOCUMENTS

| 6,063,688 | A | 5/2000 | Doyle et al. |
| 6,475,891 | B2 | 11/2002 | Moon |
| 6,521,941 | B2 * | 2/2003 | Park et al. .................. 257/315 |
| 6,723,607 | B2 * | 4/2004 | Nam et al. .................. 438/275 |

\* cited by examiner

*Primary Examiner*—Daborah Chacko Davis
(74) *Attorney, Agent, or Firm*—Finnegan, Henderson, Farabow, Garrett & Dunner, L.L.P.

(57) ABSTRACT

A method of manufacturing a semiconductor device includes forming a plurality of dummy line patterns arranged at a first pitch on an underlying region, forming first mask patterns having predetermined mask portions formed on long sides of the dummy line patterns, each of the first mask patterns having a closed-loop shape and surrounding each of the dummy line patterns, removing the dummy line patterns, forming a second mask pattern having a first pattern portion which covers end portions of the first mask patterns and inter-end portions each located between adjacent ones of the end portions, etching the underlying region using the first mask patterns and the second mask pattern as a mask to form trenches each located between adjacent ones of the predetermined mask portions, and filling the trenches with a predetermined material.

19 Claims, 6 Drawing Sheets

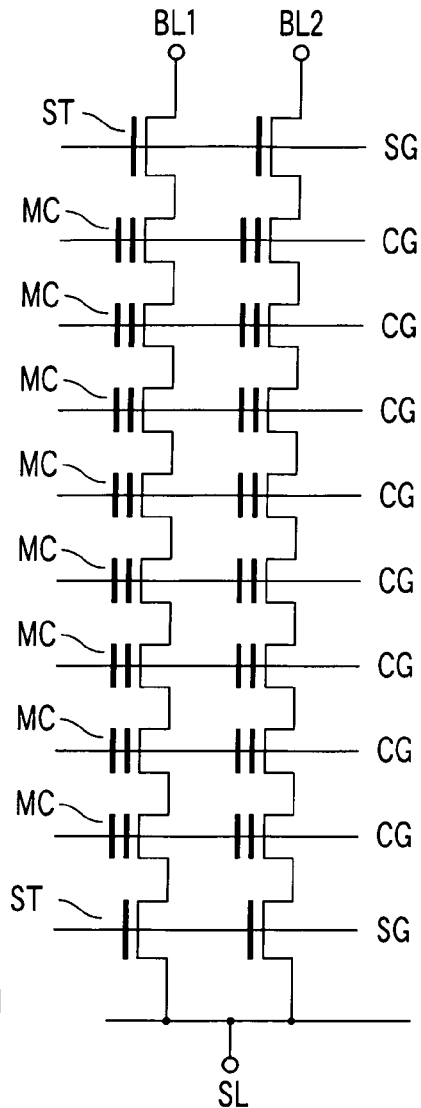
F I G. 1
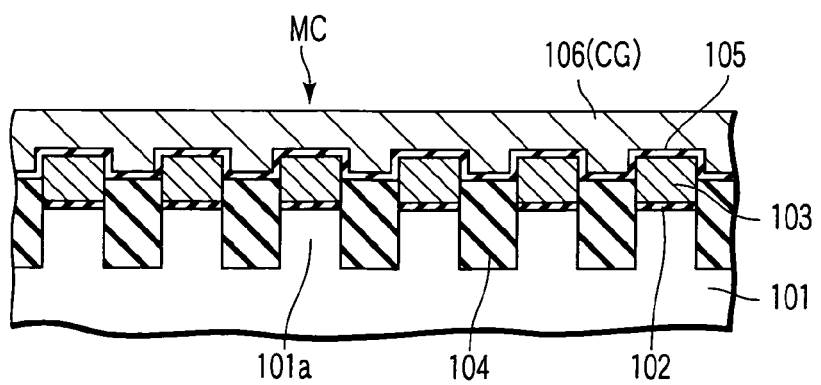
F I G. 2

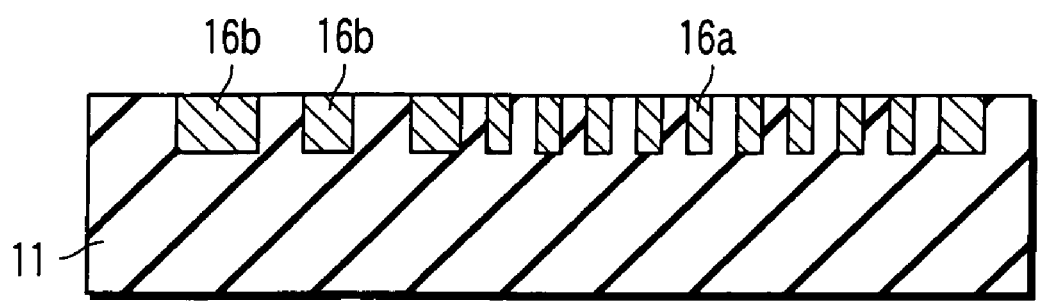
F I G. 11A
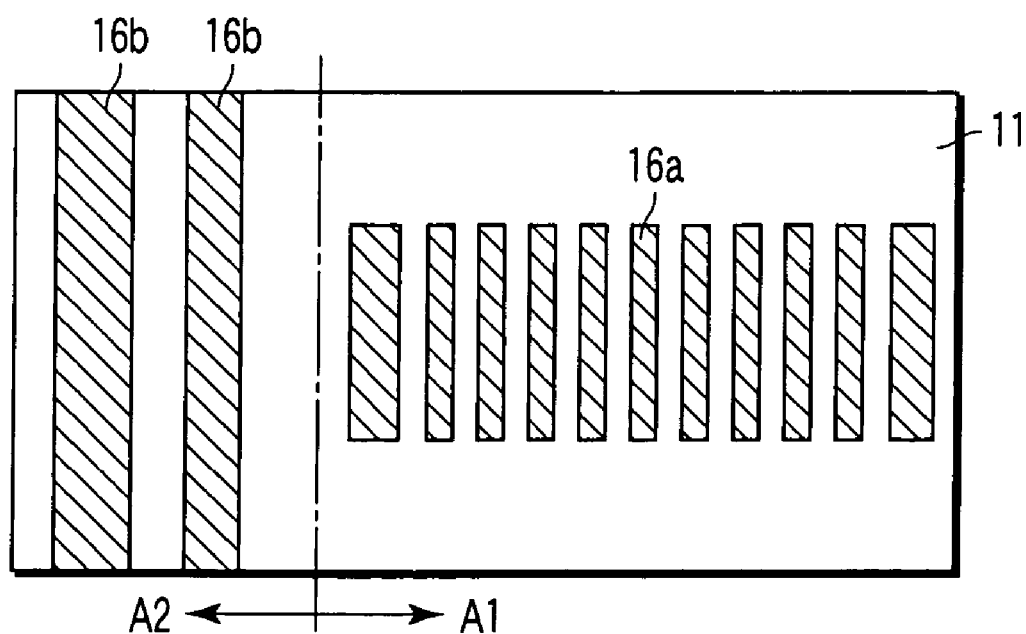
F I G. 11B

METHOD OF MANUFACTURING SEMICONDUCTOR DEVICE

CROSS-REFERENCE TO RELATED APPLICATIONS

This application is based upon and claims the benefit of priority from prior Japanese Patent Application No. 2005-176581, filed Jun. 16, 2005, the entire contents of which are incorporated herein by reference.

BACKGROUND OF THE INVENTION

1. Field of the Invention

The present invention relates to a method of manufacturing a semiconductor device.

2. Description of the Related Art

Shrinking of semiconductor devices to smaller geometries depends largely upon the lithographic techniques. For this reason, it is generally difficult to form line and space patterns which are smaller in width than the resolution limit of lithography.

To solve such a problem, a method has been proposed which involves forming sidewall patterns on the sidewalls of dummy patterns and performing an etching process using the sidewall patterns as a mask (see, for example, U.S. Pat. No. 6,063,688). For the present, this method allows line and space patterns to be formed at half of the pitch of the dummy patterns.

In forming a sidewall pattern using the usual method, a sidewall pattern in the shape of a closed loop will be formed along the entire sidewall of a dummy pattern. However, the proposed method takes no account of such a sidewall pattern in the shape of a closed loop. Therefore, no provision is made for the ends of the sidewall pattern and the regions close to the ends. It is impossible to form fine patterns for which exact and effective provisions have been made.

Thus, it is hitherto difficult to form patterns exactly and effectively and to obtain excellent semiconductor devices.

BRIEF SUMMARY OF THE INVENTION

According to an aspect of the present invention, there is provided a method of manufacturing a semiconductor device, comprising: forming a plurality of dummy line patterns arranged at a first pitch on an underlying region; forming first mask patterns having predetermined mask portions formed on long sides of the dummy line patterns, each of the first mask patterns having a closed-loop shape and surrounding each of the dummy line patterns; removing the dummy line patterns; forming a second mask pattern having a first pattern portion which covers end portions of the first mask patterns and inter-end portions each located between adjacent ones of the end portions; etching the underlying region using the first mask patterns and the second mask pattern as a mask to form trenches each located between adjacent ones of the predetermined mask portions; and filling the trenches with a predetermined material.

BRIEF DESCRIPTION OF THE SEVERAL VIEWS OF THE DRAWING

FIG. 1 shows an equivalent circuit of a NAND type flash memory to which an embodiment of the present invention is applied;

FIG. 2 is a sectional view of a region in which memory cells of the NAND type flash memory are formed; and FIGS. 3A and 3B through FIGS. 11A and 11B are sectional views and plan views, in the order of steps of manufacture, of a nonvolatile semiconductor storage device in accordance with an embodiment of the present invention.

DETAILED DESCRIPTION OF THE INVENTION

Figure 3A:
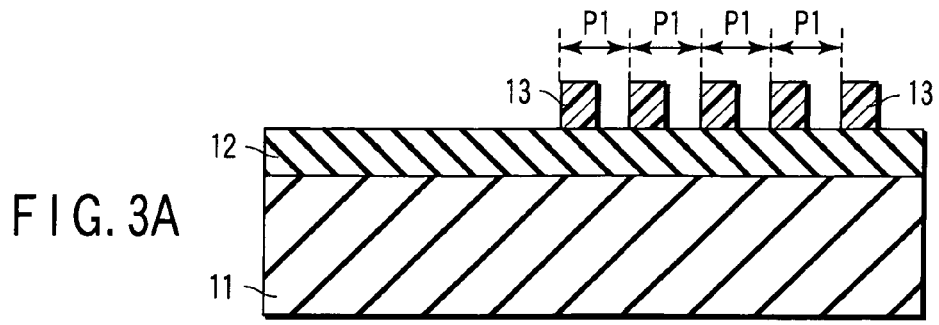

An embodiment of the present invention will be described hereinafter with reference to the accompanying drawings. In what follows, the embodiment will be described in terms of a method of manufacturing a NAND type flash memory (nonvolatile semiconductor storage device).

FIG. 1 shows an equivalent circuit of a NAND type flash memory. As shown in FIG. 1, NAND cell units are each composed of a plurality of memory cells MC connected in series between select transistors ST. A select gate line SG is connected to each of the select transistors ST. A control gate line (word line) CG is connected to each of the memory cells MC. Each of the select transistors ST arranged in the upper portion of FIG. 1 is connected to a corresponding bit line (BL1, BL2, . . . ). The select transistors ST arranged in the lower portion of FIG. 1 are connected to a source line SL.

FIG. 2 is a sectional view of a region in which the memory cells of the NAND type flash memory are formed. More specifically, FIG. 2 is a sectional view taken along the direction in which the word line extends (hereinafter referred to as the word line direction).

As shown in FIG. 2, a semiconductor substrate (for example, a silicon substrate) 101 has a plurality of device regions 101a. The adjacent device regions 101a are isolated from each other by an isolation region 104. The device regions 101a and the isolation regions 104 are formed to extend in the direction in which the bit lines extend (hereinafter referred to as the bit line direction). Each of the device regions 101a is formed on top with a tunnel insulating film 102. A floating gate electrode 103 is formed on the tunnel insulating film 102. An interelectrode insulating film 105 is formed on the floating gates 103 and the isolation regions 104. A control gate line (CG) 106 is formed on the interelectrode insulating film 105 to extend in the word line direction. Though not shown, the semiconductor substrate 101 is also formed with the select transistors, the select gate lines, peripheral-circuit transistors, etc.

A semiconductor device manufacturing method according to the present embodiment will be described below with reference to FIGS. 3A and 3B through FIGS. 11A and 11B. FIGS. 3A through 11A are sectional views taken along the word line direction and FIGS. 3B through 11B are plan views.

Figure 3B:
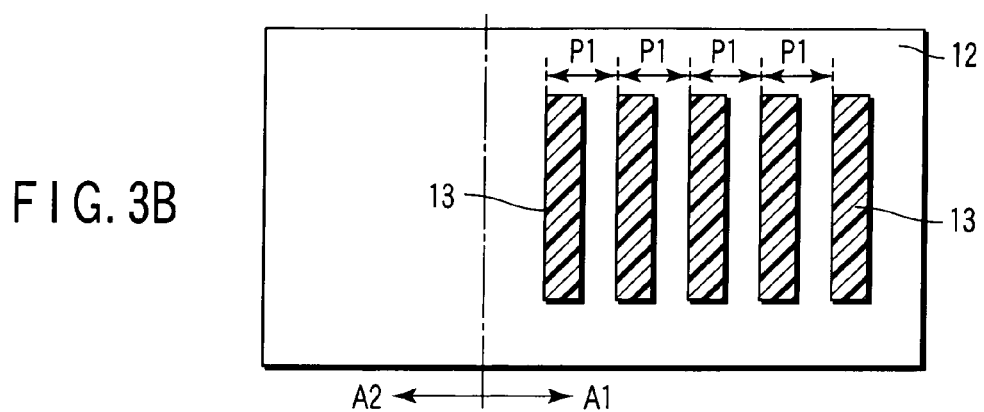

First, as shown in FIGS. 3A and 3B, a TEOS oxide film is formed as an interlayer insulating film (underlying region) 11 on the lower structure (not shown) formed with such memory cells MC as shown in FIG. 2. The lower structure may contain, for example, source lines in addition to the memory cells, transistors, etc. Then, a BSG film is formed as a hard mask film 12 on the surface of the interlayer insulating film 11.

Next, a plurality of photoresist patterns (preliminary patterns) 13 is formed on the surface of the hard mask film 12. The photoresist patterns 13 are intended to form line and space patterns for bit lines and formed in the bit line formation area (line and space pattern formation area) A1 but not in the peripheral area A2. The photoresist patterns 13, which are formed using usual photolithographic techniques, have a width not less than the width defined by the resolution limit of lithography. The photoresist patterns 13 are arranged at a pitch P1 (first pitch).

Figure 4A:
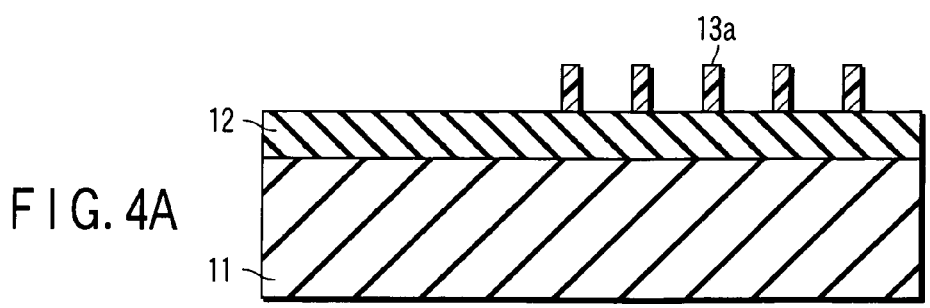
Figure 4B:
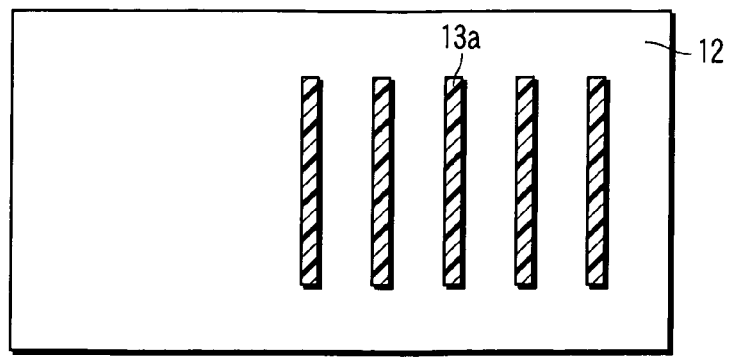

Next, as shown in FIGS. 4A and 4B, the photoresist patterns 13 are slimmed using usual slimming techniques, thereby obtaining photoresist patterns 13a of reduced width. Suppose, for example, that the width of the slimmed photoresist patterns 13a is about half (about 45 to 55%) of the width of the photoresist patterns 13 before slimming. Thus, the use of the slimming techniques allows the photoresist patterns 13a having a width smaller than the resolution limit width of photolithography to be obtained even if the width of the original photoresist patterns 13 is not smaller than the resolution limit width.

Figure 5A:
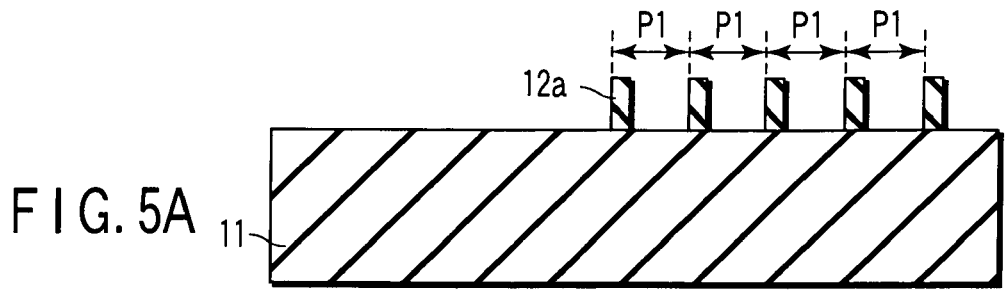
Figure 5B:
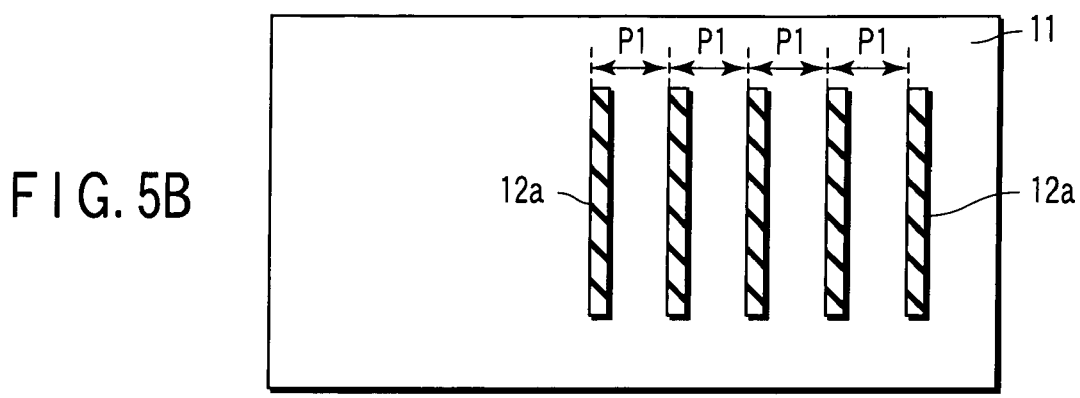

Next, as shown in FIGS. 5A and 5B, the hard mask film 12 is patterned by means of RIE (reactive ion etching) using the slimmed photoresist patterns 13a as a mask. Thereby, hard mask patterns 12a are formed as dummy line patterns. The dummy line patterns 12a are also arranged at pitch P1. The width of each dummy line pattern 12a is smaller than the width defined by the resolution limit of lithography. The photoresist patterns 13a are then removed.

Figure 6A:
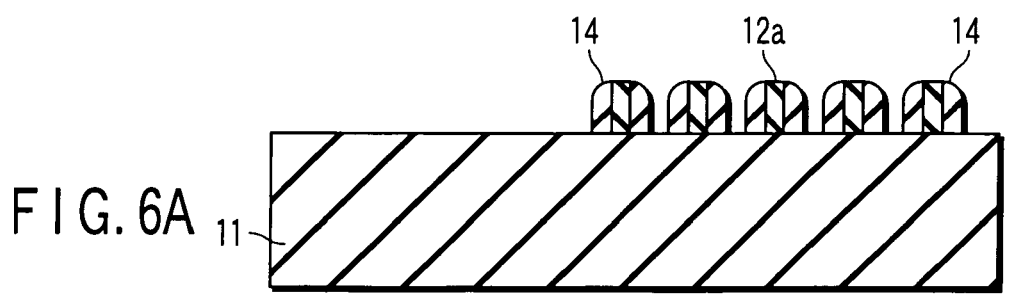
Figure 6B:
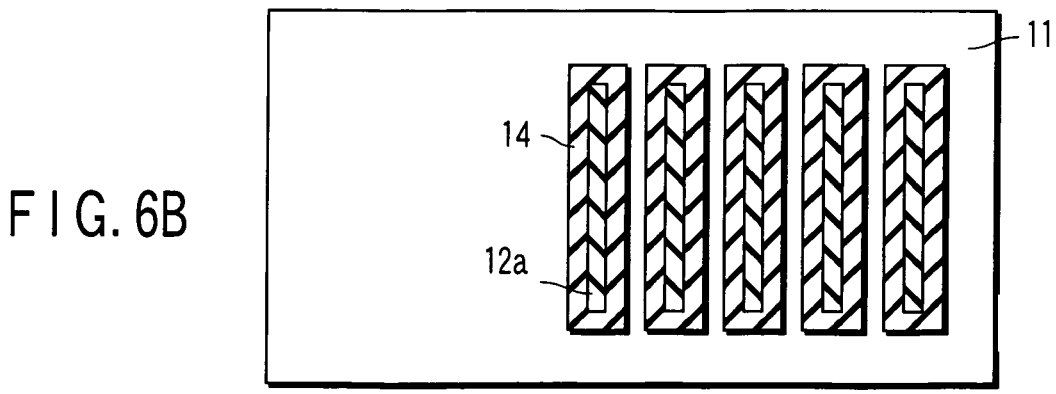

Next, as shown in FIGS. 6A and 6B, a silicon nitride film is formed over the entire surface to cover the dummy line patterns 12a and the interlayer insulating film 11. Subsequently, the silicon nitride film is etched by means of anisotropic etching such as RIE. As the result, each of the dummy line patterns 12a is formed on the entire sidewall (on the entire side) with a sidewall mask pattern (first mask pattern) 14 in the shape of a closed loop to surround it. That is, each of the sidewall mask patterns 14 has portions formed on the long sides of the dummy line pattern 12a (the sides along a longitudinal line of the dummy line pattern) (hereinafter referred to as the long sidewall pattern portions) and portions formed on both end surfaces of the dummy line pattern 12a.

Figure 7A:
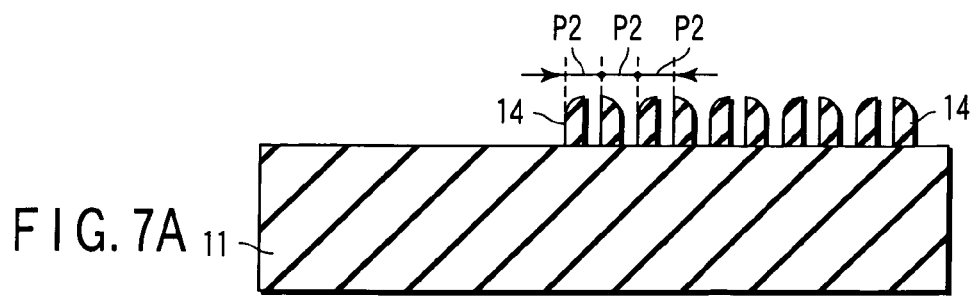
Figure 7B:
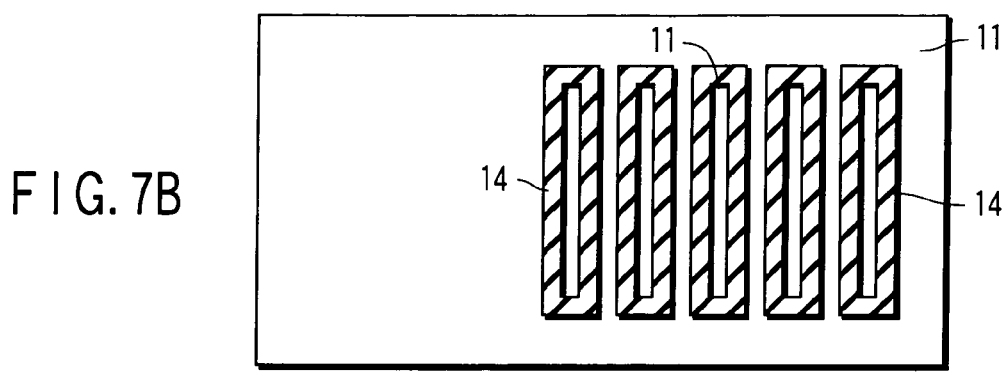

Next, as shown in FIGS. 7A and 7B, the dummy line patterns 12a are selectively etched relative to the interlayer insulating film 11 and the sidewall mask patterns 14. Thus, the dummy line patterns 12a are removed. For this selective etching, use is made of, for example, vapor hydrofluoric acid (HF) or a mixed solution of sulfuric acid ($H_2SO_4$) and hydrofluoric acid (HF).

The long sidewall pattern portions of the sidewall mask patterns 14 thus formed are arranged at pitch P2 (second pitch) in the word line direction. The pitch P2 is half of the pitch P1 of the photoresist patterns 13, or the dummy line patterns 12a. By controlling the width of the dummy line patterns 12a and the film thickness of the sidewall mask patterns 14, the long sidewall pattern portions of the sidewall mask patterns 14 can be spaced at regular intervals, thus allowing the long sidewall pattern portions to be arranged at pitch P2. The sidewall mask patterns 14 are formed without using photolithographic techniques; thus allowing the long sidewall pattern portions of the sidewall mask patterns 14 to be formed at a pitch smaller than the one determined by the resolution limit of photolithography.

Figure 8A:
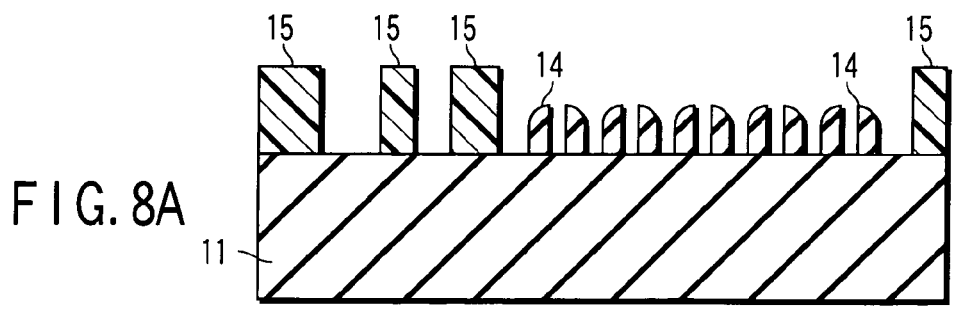
Figure 8B:
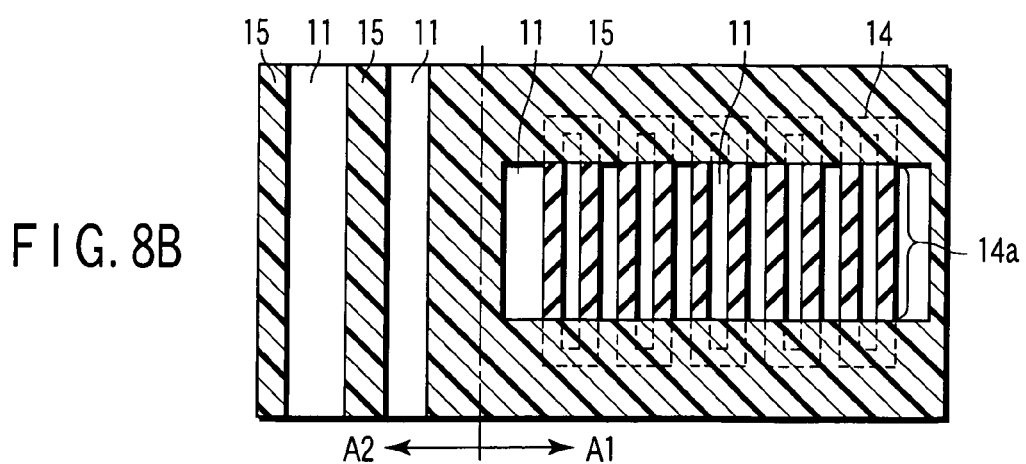

Next, as shown in FIGS. 8A and 8B, photoresist patterns (second mask patterns) 15 are formed through the use of usual photolithographic techniques. These patterns are formed in both the bit line formation area A1 and the peripheral area A2.

In the bit line formation area A1, the photoresist pattern 15 has portions (first pattern portions) that cover the end portions of the sidewall mask patterns 14 and portions between each end portion of the adjacent sidewall mask patterns 14. In other words, the photoresist pattern 15 does not cover predetermined mask portions 14a of the long sidewall pattern portions of the sidewall mask patterns 14 and portions between each of the predetermined mask portions 14a and the next.

In the peripheral area A2, the photoresist patterns 15 have pattern portions (second pattern portions) for forming peripheral patterns. The photoresist patterns 15 are formed by means of usual photolithographic techniques; therefore, the width of the peripheral patterns formed in the peripheral area A2 is not less than the one defined by the resolution limit of lithography. Also, the width of the peripheral patterns is greater than the width of the predetermined mask portions 14a of the sidewall mask patterns 14.

Figure 9A:
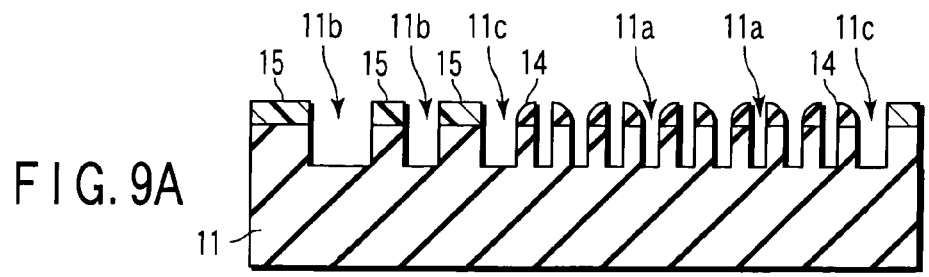
Figure 9B:
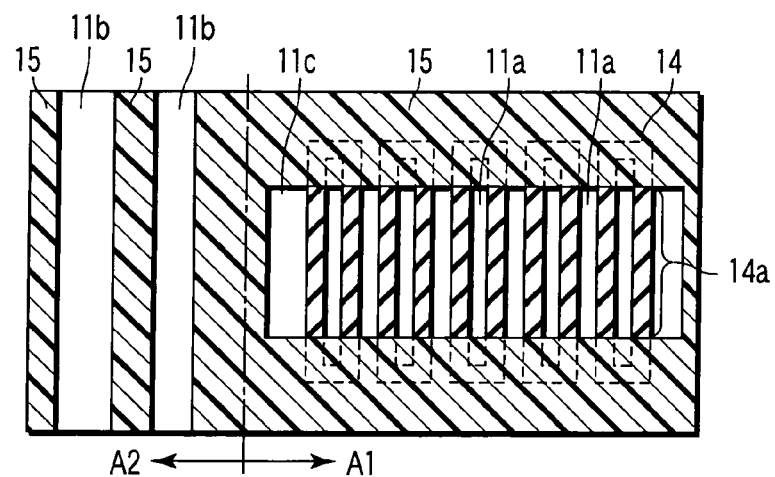

Next, as shown in FIGS. 9A and 9B, the interlayer insulating film 11 in the bit line formation area A1 and the peripheral area A2 is etched by means of RIE using the sidewall mask patterns 14 and the photoresist patterns 15 as a mask. By this etching process, in the bit line formation area A1, trenches 11a for the bit lines are formed in portions of the interlayer insulating film 11 between each of the predetermined mask portions 14a and the next. In the peripheral area A2, trenches 11b for interconnect lines are formed in the interlayer insulating film in correspondence with the peripheral patterns. Trenches 11c are also formed in the bit line formation area A1. The trenches 11c are dummy ones; therefore, the trench on the right-hand side and the trench on the left-hand side are allowed to differ in width from each other through alignment errors.

Figure 10A:
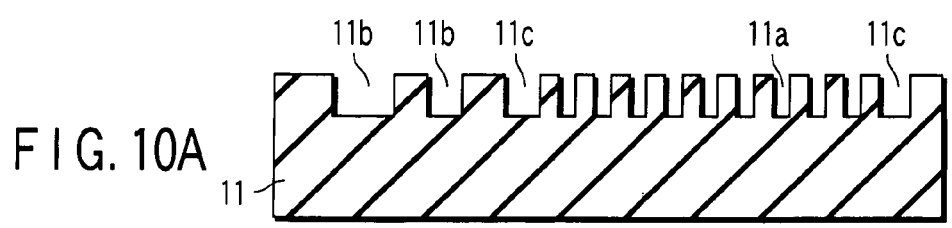
Figure 10B:
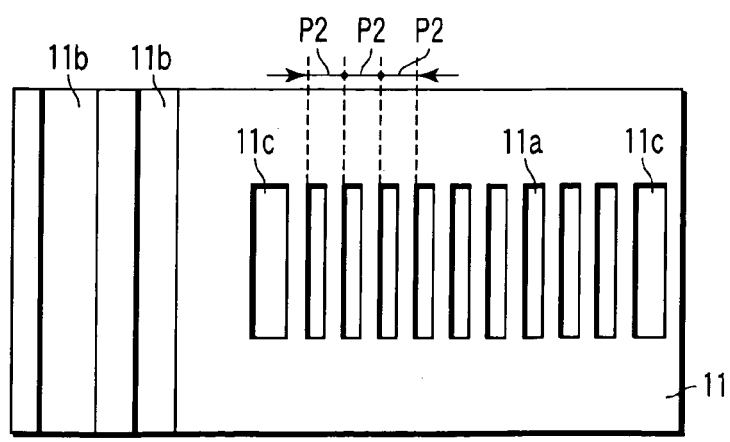

Next, as shown in FIGS. 10A and 10B, the photoresist patterns 15 are removed by means of ashing. Further, the sidewall mask patterns 14 are removed using hot phosphoric acid. As shown in FIG. 10B, the pitch of the bit line trenches 11a is P2, which is half of the pitch P1 of the dummy line patterns 12a. As will be described below, each of the trenches 11a is formed independently.

If the interlayer insulating film 11 were etched without forming the photoresist patterns 15, all the areas which are not covered with the sidewall mask patterns 14 would be etched. As the result, the trenches 11a outside the sidewall mask patterns 14 in the shape of a closed loop would be connected with one another. If, under such a circumstance, the trenches 11a were filled with a conductive material to form interconnect lines, the interconnect lines which should inherently be electrically isolated from one another would be electrically connected with one another. In this embodiment, as already described, the end portions of the sidewall mask patterns 14 and the portions between adjacent end portions are covered with the photoresist patterns 15. Therefore, the multiple trenches 11a which are independent of one another can be formed with certainty. In addition, since the peripheral patterns are formed at the same time using the photoresist patterns 15, it is not required to form additional photoresist patterns in order to form the independent trenches 11a.

Next, as shown in FIGS. 11A and 11B, a film of copper (Cu) as a conducting film is formed over the entire surface. Subsequently, the copper film is planarized by means of CMP (chemical mechanical polishing). Thereby, patterns of conducting material are formed which have the trenches 11a, 11b and 11c filled with the conducting material (predetermined material). That is, bit line patterns as conducting patterns 16a are formed in the bit line formation area A1. Interconnect patterns as conducting patterns 16b are formed in the peripheral area A2. The interconnect patterns 16b are used, for example, to interconnect NAND blocks. For the conducting material, use may be made of a semiconductor material, such as polysilicon, in addition to a metal material such as copper.

Thus, the line and space patterns for the bit lines in the bit line formation area A1 and the interconnect patterns in the peripheral area A2 are formed at the same time.

According to this embodiment, as described above, the ends of the sidewall mask patterns 14 and the portions between the ends of adjacent sidewall mask patterns are covered with the photoresist patterns 15 and the interlayer insulating film (underlying region) 11 is then etched using the photoresist patterns 15 and the sidewall mask patterns 14 as a mask. For this reason, the separate trenches 11a can be formed exactly at a pitch smaller than the one determined by the resolution limit of lithography. Therefore, by filling the trenches 11a thus formed with a predetermined material, line and space patterns can be formed at a pitch smaller than the one determined by the resolution limit of lithography. In particular, in forming interconnect patterns by filling the trenches 11a with a conducting material, it becomes possible to avoid the problem that interconnect lines are electrically connected with one another because the trenches 11a are separated from one another.

Furthermore, the photoresist patterns 15 include patterns for forming peripheral patterns, which allows the independent trenches 11a and trenches for the peripheral patterns to be formed at the same time using common lithography and etching process. Accordingly, desired patterns can be formed exactly and efficiently in the line and space pattern formation area A1 and the peripheral area A2.

Although the embodiment has been described in terms of line and space patterns for the bit lines of a nonvolatile semiconductor memory device, the principles of the embodiment are also applicable to line and space patterns for other than the bit lines.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:
    forming a plurality of dummy line patterns arranged at a first pitch on an underlying region, the dummy line patterns having long sides and short sides;
    forming first mask patterns having predetermined mask portions formed on the long sides of the dummy line patterns, each of the first mask patterns having a closed-loop shape and surrounding each of the dummy line patterns;
    removing the dummy line patterns to form preliminary trenches, the preliminary trenches having long sides and short sides corresponding to the long sides and the short sides of the dummy line patterns;
    forming a second mask pattern having a first pattern portion which covers end portions of the first mask patterns, inter-end portions each located between adjacent ones of the end portions, and the short sides of the preliminary trenches;
    etching the underlying region using the first mask patterns and the second mask pattern as a mask to form trenches each located between adjacent ones of the predetermined mask portions; and
    filling the trenches with a predetermined material.

2. The method according to claim 1, wherein the trenches are arranged at a second pitch which is half of the first pitch.

3. The method according to claim 1, wherein the predetermined material is a conducting material.

4. The method according to claim 1, wherein interconnect lines are formed by filling the trenches with the predetermined material.

5. The method according to claim 4, wherein the interconnect lines are bit lines of a nonvolatile semiconductor memory.

6. The method according to claim 1, wherein the underlying region includes an interlayer insulating film.

7. The method according to claim 1, wherein the second mask pattern is a resist pattern.

8. The method according to claim 1, wherein forming the first mask patterns includes forming a covering film which covers the dummy line patterns, and subjecting the covering film to an anisotropic etching process to form the first mask patterns.

9. The method according to claim 1, wherein forming the dummy line patterns includes forming preliminary patterns on the underlying region which are larger in width than the dummy line patterns, and reducing the width of the preliminary patterns.

10. The method according to claim 9, wherein a width of the preliminary pattern is not less than a width defined by a resolution limit of lithography.

11. The method according to claim 1, wherein forming the dummy line patterns includes forming a hard mask film on the underlying region, forming preliminary patterns on the hard mask film, slimming the preliminary patterns, and patterning the hard mask film using the slimmed preliminary patterns as a mask to form the dummy line patterns.

12. The method according to claim 1, wherein a width of the predetermined mask portion is smaller than a width defined by a resolution limit of lithography.

13. The method according to claim 1, wherein a width of the dummy line pattern is smaller than a width defined by a resolution limit of lithography.

14. The method according to claim 1, wherein the second mask pattern further includes a second pattern portion for forming a peripheral pattern.

15. The method according to claim 14, wherein an additional trench corresponding to the peripheral pattern is formed by etching the underlying region using the first mask patterns and the second mask pattern as a mask.

16. The method according to claim 15, wherein filling the trenches with the predetermined material includes filling the additional trench with the predetermined material.

17. The method according to claim 16, wherein an interconnect line is formed by filling the additional trench with the predetermined material.

18. The method according to claim 14, wherein a width of the peripheral pattern is larger than a width of the predetermined mask portion of the first mask pattern.

19. The method according to claim 14, wherein a width of the peripheral pattern is not less than a width defined by a resolution limit of lithography.

* * * * *